(12) United States Patent
Wada

(10) Patent No.: US 10,216,176 B2
(45) Date of Patent: Feb. 26, 2019

(54) SUBSTRATE PROCESSING APPARATUS

(71) Applicant: ASM IP Holding B.V., Almere (NL)

(72) Inventor: Takashi Wada, Kanagawa (JP)

(73) Assignee: ASM IP HOLDING B.V., Almere (NL)

( * ) Notice: Subject to any disclaimer, the term of this patent is extended or adjusted under 35 U.S.C. 154(b) by 1035 days.

(21) Appl. No.: 14/264,698

(22) Filed: Apr. 29, 2014

(65) Prior Publication Data
US 2015/0309504 A1    Oct. 29, 2015

(51) Int. Cl.
*G05B 19/418*    (2006.01)
*H01L 21/677*    (2006.01)

(52) U.S. Cl.
CPC .... *G05B 19/4189* (2013.01); *H01L 21/67742* (2013.01); *H01L 21/67745* (2013.01); *G05B 2219/45031* (2013.01); *Y02P 90/20* (2015.11); *Y02P 90/28* (2015.11)

(58) Field of Classification Search
CPC .................................................. G05B 19/4189
USPC .......................................................... 700/112
See application file for complete search history.

(56) References Cited

U.S. PATENT DOCUMENTS

| | | | | |
|---|---|---|---|---|
| 4,521,852 A | * | 6/1985 | Guttag | G06F 12/1433 |
| | | | | 711/163 |
| 4,825,808 A | * | 5/1989 | Takahashi | C23C 14/568 |
| | | | | 118/715 |
| 4,851,101 A | * | 7/1989 | Hutchinson | C23C 14/568 |
| | | | | 204/192.12 |
| 4,917,556 A | * | 4/1990 | Stark | B65G 47/915 |
| | | | | 198/394 |
| 5,509,191 A | * | 4/1996 | Best | B23P 21/004 |
| | | | | 29/722 |
| 5,855,465 A | * | 1/1999 | Boitnott | H01L 21/67745 |
| | | | | 204/298.25 |

(Continued)

FOREIGN PATENT DOCUMENTS

| | | |
|---|---|---|
| JP | 2003-264218 A | 9/2003 |
| JP | 2004-119635 A | 4/2004 |

(Continued)

OTHER PUBLICATIONS

An Office Action issued by the Taiwanese Patent Office dated Jan. 15, 2018, which corresponds to Taiwanese Patent Application No. 104109923 and is related to U.S. Appl. No. 14/264,698; with English translation.

(Continued)

*Primary Examiner* — Evral E Bodden
(74) *Attorney, Agent, or Firm* — Studebaker & Brackett PC

(57) ABSTRACT

A substrate processing apparatus includes a plurality of arms used for transferring a substrate, a plurality of processing sections for processing the substrate, a recipe storage section storing at least one recipe for designating at least one of the plurality of arms as a usable arm and at least one of the plurality of processing sections as a usable processing section and for specifying processing conditions in the usable processing section, and a control unit for, according to the at least one recipe, controlling the plurality of arms and the plurality of processing sections so that a substrate is transferred using the usable arm and is processed in the usable processing section under the processing conditions.

5 Claims, 6 Drawing Sheets

(56) References Cited

U.S. PATENT DOCUMENTS

| | | | |
|---|---|---|---|
| 5,882,168 A * | 3/1999 | Thompson | H01L 21/67173 414/416.01 |
| 5,963,315 A * | 10/1999 | Hiatt | H01L 21/67745 356/237.3 |
| 6,828,772 B1 * | 12/2004 | Hofer | B25J 15/0004 257/E21.525 |
| 7,472,387 B2 * | 12/2008 | Nakano | H01L 21/67276 717/174 |
| 8,055,376 B2 * | 11/2011 | Doki | H01L 21/68 414/936 |
| 2006/0079156 A1 * | 4/2006 | Polyak | B24B 37/04 451/41 |
| 2008/0183331 A1 * | 7/2008 | Yeh | H01L 21/6723 700/248 |
| 2012/0305196 A1 | 12/2012 | Mori et al. | |
| 2013/0322990 A1 * | 12/2013 | Chen | H01L 21/6773 414/217 |

FOREIGN PATENT DOCUMENTS

| | | |
|---|---|---|
| JP | 2005-101320 A | 4/2005 |
| JP | 2011-233721 A | 11/2011 |
| JP | 2012-067346 A | 4/2012 |
| JP | 2012-138540 A | 7/2012 |

OTHER PUBLICATIONS

An Office Action mailed by the Japanese Patent Office dated Jun. 26, 2018, which corresponds to Japanese Patent Application No. 2015-054088 and is related to U.S. Appl. No. 14/264,698.

An Office Action mailed by the Japanese Patent Office dated Oct. 9, 2018, which corresponds to Japanese Patent Application No. 2015-054088 and is related to U.S. Appl. No. 14/264,698.

An Office Action mailed by the Taiwan Patent Office dated Sep. 14, 2018, which corresponds to Taiwan Patent Application No. 104109923 and is related to U.S. Appl. No. 14/264,698.

* cited by examiner

FIG. 5

SUBSTRATE PROCESSING APPARATUS

BACKGROUND OF THE INVENTION

Field of the Invention

The present invention relates to a substrate processing apparatus having a plurality of processing sections for processing a substrate.

Background Art

US2012/0305196A1 discloses a substrate processing apparatus having a plurality of processing sections for processing a substrate.

Substrates are sometimes processed in a plurality of processing sections under different processing conditions in a substrate processing apparatus, especially in a product development stage. It has been found, however, that in such cases, contamination resulting from processing a substrate under some processing conditions may adhere to substrates processed under other processing conditions, due to handling of these substrates by transfer arms.

SUMMARY OF THE INVENTION

The present invention has been made to solve this problem. It is, therefore, an object of the present invention to provide a substrate processing apparatus in which a simple method is used to prevent contamination from adhering to substrates due to handling of these substrates by transfer arms.

The features and advantages of the present invention may be summarized as follows.

According to one aspect of the present invention, a substrate processing apparatus includes a plurality of arms used for transferring a substrate, a plurality of processing sections for processing the substrate, a recipe storage section storing at least one recipe for designating at least one of the plurality of arms as a usable arm and at least one of the plurality of processing sections as a usable processing section and for specifying processing conditions in the usable processing section, and a control unit for, according to the at least one recipe, controlling the plurality of arms and the plurality of processing sections so that a substrate is transferred using the usable arm and is processed in the usable processing section under the processing conditions.

According to another aspect of the present invention, a substrate processing apparatus includes a plurality of arms used for transferring a substrate, a plurality of processing sections for processing the substrate, and a control unit for controlling movement of the plurality of arms and controlling processing in the plurality of processing sections. The control unit is configured so that, using system parameters, at least one of the plurality of arms can be designated as a usable arm and at least one of the plurality of processing sections can be designated as a usable processing section.

Other and further objects, features and advantages of the invention will appear more fully from the following description.

BRIEF DESCRIPTION OF THE DRAWINGS

FIG. 5 is a diagram of a screen displaying the content of the metal film forming recipe.

DETAILED DESCRIPTION OF THE PREFERRED EMBODIMENTS

Figure 1:
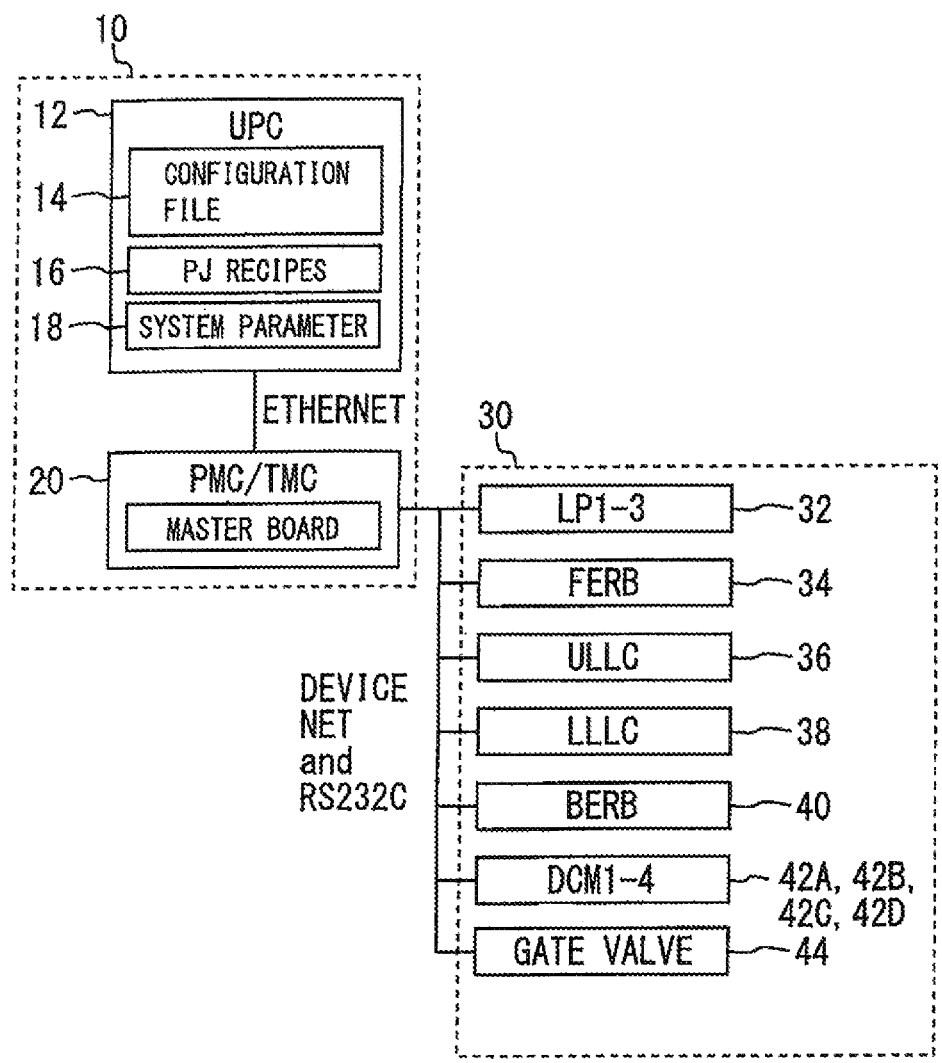
FIG. 1 is a block diagram of a substrate processing apparatus in accordance with a first embodiment.

Substrate processing apparatuses in accordance with embodiments of the present invention will be described with reference to the accompanying drawings. Throughout the specification the same or corresponding components are designated by the same reference numerals and may be described only once.

First Embodiment

FIG. 1 is a block diagram of a substrate processing apparatus in accordance with a first embodiment of the present invention. This substrate processing apparatus includes a control unit 10 and a processing unit 30 controlled by the control unit 10.

The control unit 10 includes a controller 12 configured, e.g., of a unique platform controller (UPC). The controller 12 has a function to schedule substrate processing and issue execution instructions for substrate processing. The controller 12 includes a configuration storage section 14, a recipe storage section 16, and a system parameter storage section 18.

The configuration storage section 14 stores information about the configuration of the substrate processing apparatus. The recipe storage section 16 stores recipes specifying conditions for substrate processing, etc. The system parameter storage section 18 stores information as to basic system environment settings for the substrate processing apparatus, such as the presence or absence of an alarm and language setting.

The control unit 10 further includes a module controller 20 connected to the controller 12. The module controller 20 is configured, e.g., of a process module controller/transfer module controller (PMC/TMC).

The processing unit 30 includes at least one load port 32, a first arm 34, a ULLC (or upper load lock chamber) 36, an LLLC (or lower load lock chamber) 38, a second arm 40, a first processing section 42A, a second processing section 42B, a third processing section 42C, a fourth processing section 42D, and gate valves 44. These components are connected to and controlled by the module controller 20.

Figure 2:
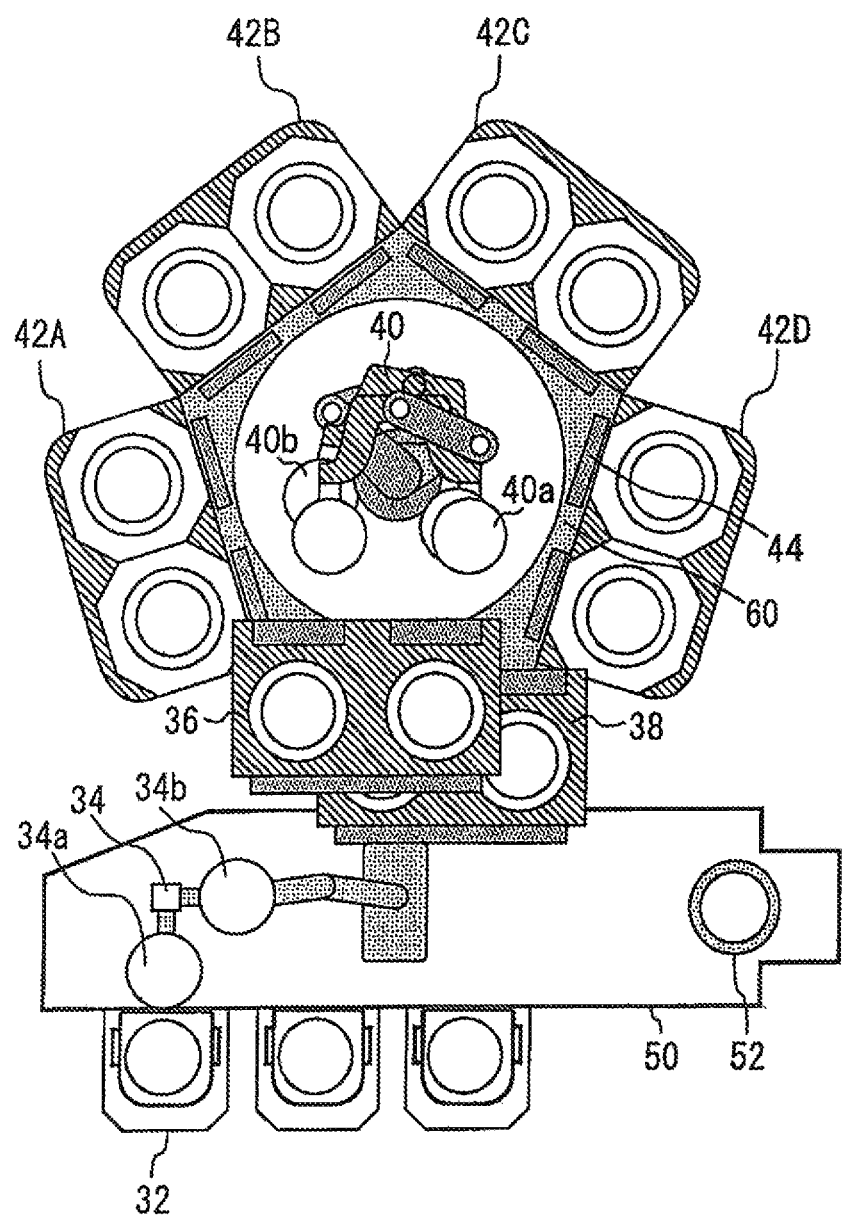
FIG. 2 is a plan view of the processing unit.

FIG. 2 is a plan view of the processing unit 30. The processing unit 30 includes an Equipment Front End Module (EFEM) 50. A first arm 34 and a plurality of cooling stages 52 are provided in the EFEM 50. The first arm 34 is provided with an upper arm 34a and a lower arm 34b and hence is capable of transferring two substrates separately. A substrate is mounted on each cooling stage 52 and cooled.

The load port 32, the ULLC 36, and the LLLC 38 are connected to the EFEM 50. The ULLC 36 is located directly above the LLLC 38, although the ULLC 36 is shown in FIG. 2 to be displaced relative to the LLLC 38 and cover only the upper left portion of the LLLC 38, for convenience of illustration. The first arm 34 is used to transfer a substrate(s) between any two of the load port 32, the ULLC 36, the LLLC 38, and the cooling stages 52.

The processing unit 30 includes a vacuum chamber 60, which is also called wafer handling chamber. The second arm 40 is provided in the vacuum chamber 60. The second arm 40 is provided with two upper arms 40a and two lower arms 40b and hence is capable of transferring two pairs of substrates separately.

The ULLC 36, the LLLC 38, and the first to fourth processing sections 42A, 42B, 42C, and 42D are connected to the vacuum chamber 60. The first processing section 42A is configured of a dual chamber module (DCM) to process two substrates concurrently. The second to fourth processing sections 42B, 42C, and 42D are also configured of a DCM to process two substrates concurrently. It should be noted that the first to fourth processing sections 42A, 42B, 42C, and 42D compose the plurality of processing sections. Further, the upper arm 34a, the lower arm 34b, the upper arms 40a, and the lower arms 40b compose the plurality of arms.

The second arm 40 is used to transfer a substrate(s) between the ULLC 36 or the LLLC 38 and any one of the processing sections 42A to 42D (the plurality of processing sections). Some of the gate valves 44 are provided between the vacuum chamber 60 and the processing sections 42A, 42B, 42C, and 42D, others are provided between the vacuum chamber 60 and the ULLC 36 and the LLLC 38, and the rest are provided between the EFEM 50 and the ULLC 36 and the LLLC 38.

Figure 3:
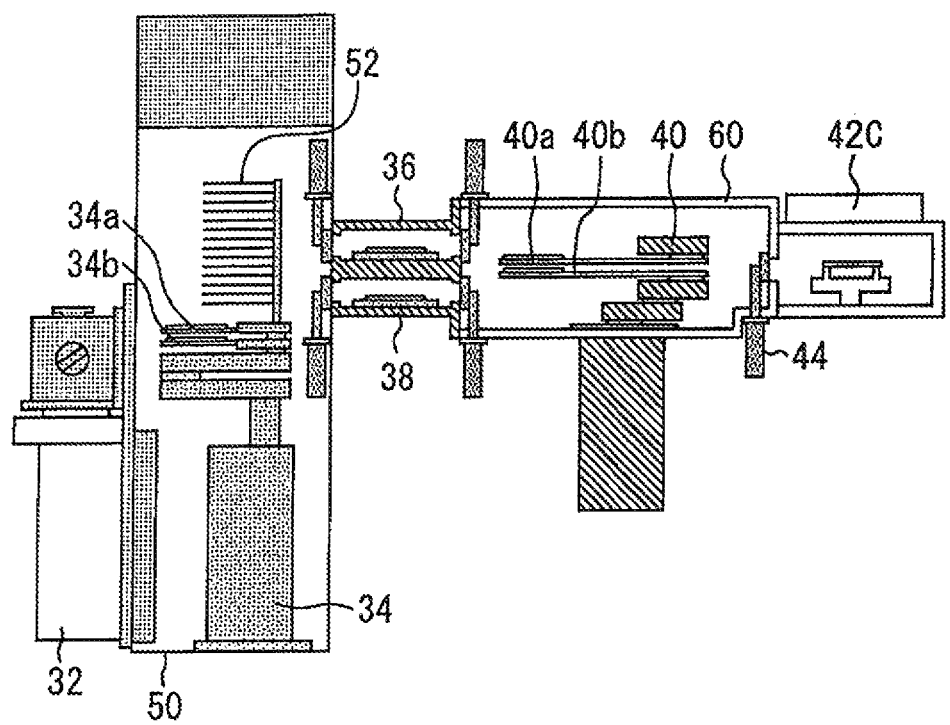
FIG. 3 is a diagram showing the internal configuration of the processing unit.

FIG. 3 is a diagram showing the internal configuration of the processing unit 30. In this example there are 14 of the cooling stages 52 so that 14 substrates can be held and air-cooled concurrently. The lowest cooling stage 52 is referred to herein as the slot 1, and the cooling stage 52 immediately above the lowest cooling stage 52 is referred to herein as the slot 2. In this way the other 12 cooling stages 52 may be separately referred to as the slots 3 to 14.

Referring back to FIG. 1, each recipe stored in the recipe storage section 16 designates some of the arms 34a, 34b, 40a, and 40b as usable arms and some of the processing sections 42A, 42B, 42C, and 42D as usable processing sections and specifies processing conditions in the usable processing sections. Further, each recipe also designates some of the cooling stages 52 as usable cooling stages and one of the load lock chambers (i.e., either the ULLC 36 or the LLLC 38) as a usable load lock chamber.

Figure 4:
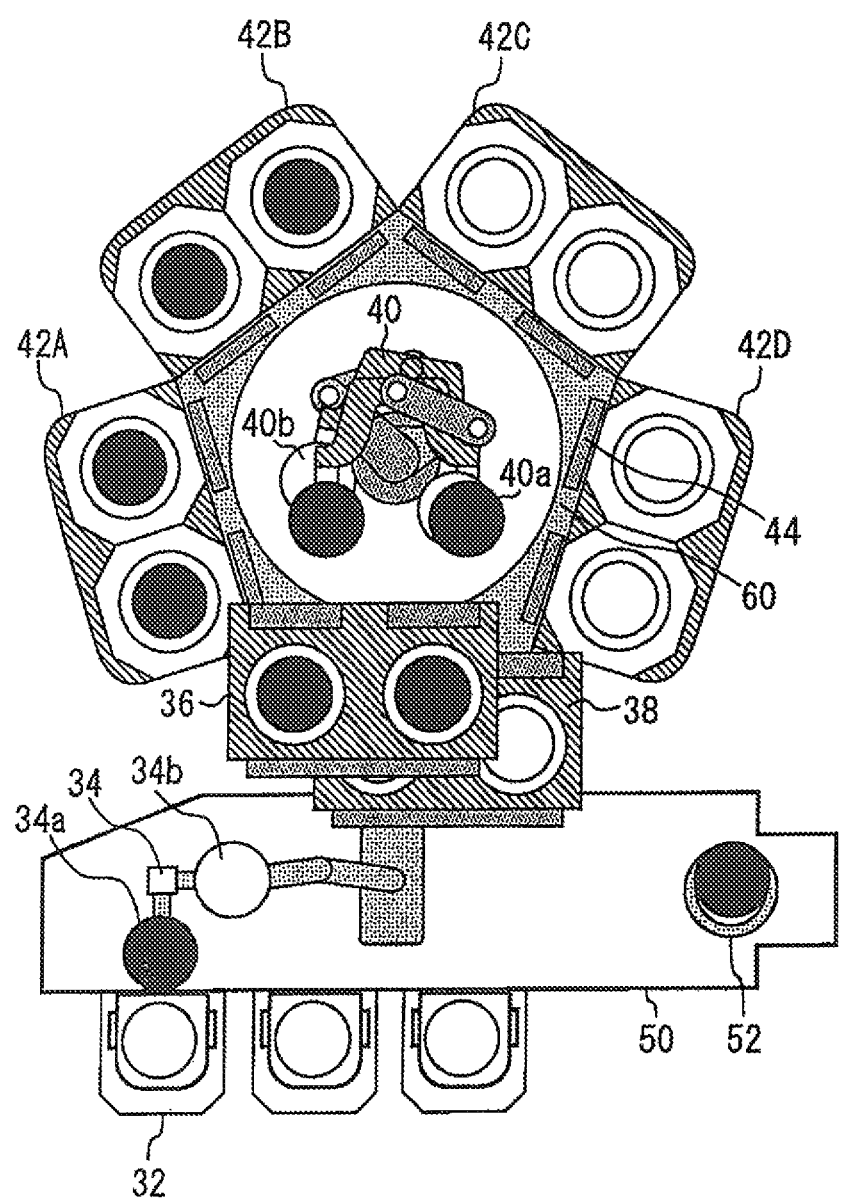
FIG. 4 is a plan view of the processing unit in which the black circles and white circles are added.

These recipes will be specifically described. The recipe storage section 16 stores a metal film forming recipe for forming a metal film and a nonmetal film forming recipe for forming a nonmetal film. FIG. 4 is a plan view of the processing unit, wherein the black circles indicate components used according to the metal film forming recipe and white circles indicate components used according to the nonmetal film forming recipe. Specifically, the metal film forming recipe designates the upper arms 34a and 40a as usable arms and the first processing section 42A and the second processing section 42B as usable processing sections. Further, the metal film forming recipe designates the upper 7 of the cooling stages 52 (i.e., the slots 8 to 14) as usable cooling stages and the ULLC 36 as a usable load lock chamber. The metal film forming recipe also specifies processing conditions for forming a metal film; in this example it specifies processing conditions for forming a Ti or W film.

The nonmetal film forming recipe, on the other hand, designates the lower arms 34b and 40b as usable arms and the third processing section 42C and the fourth processing section 42D as usable processing sections. Further, the nonmetal film forming recipe designates the lower 7 of the cooling stages 52 (i.e., the slots 1 to 7) as usable cooling stages and the LLLC 38 as a usable load lock chamber. The nonmetal film forming recipe also specifies processing conditions for forming a nonmetal film; in this example it specifies processing conditions for forming an oxide or nitride film.

Figure 5:
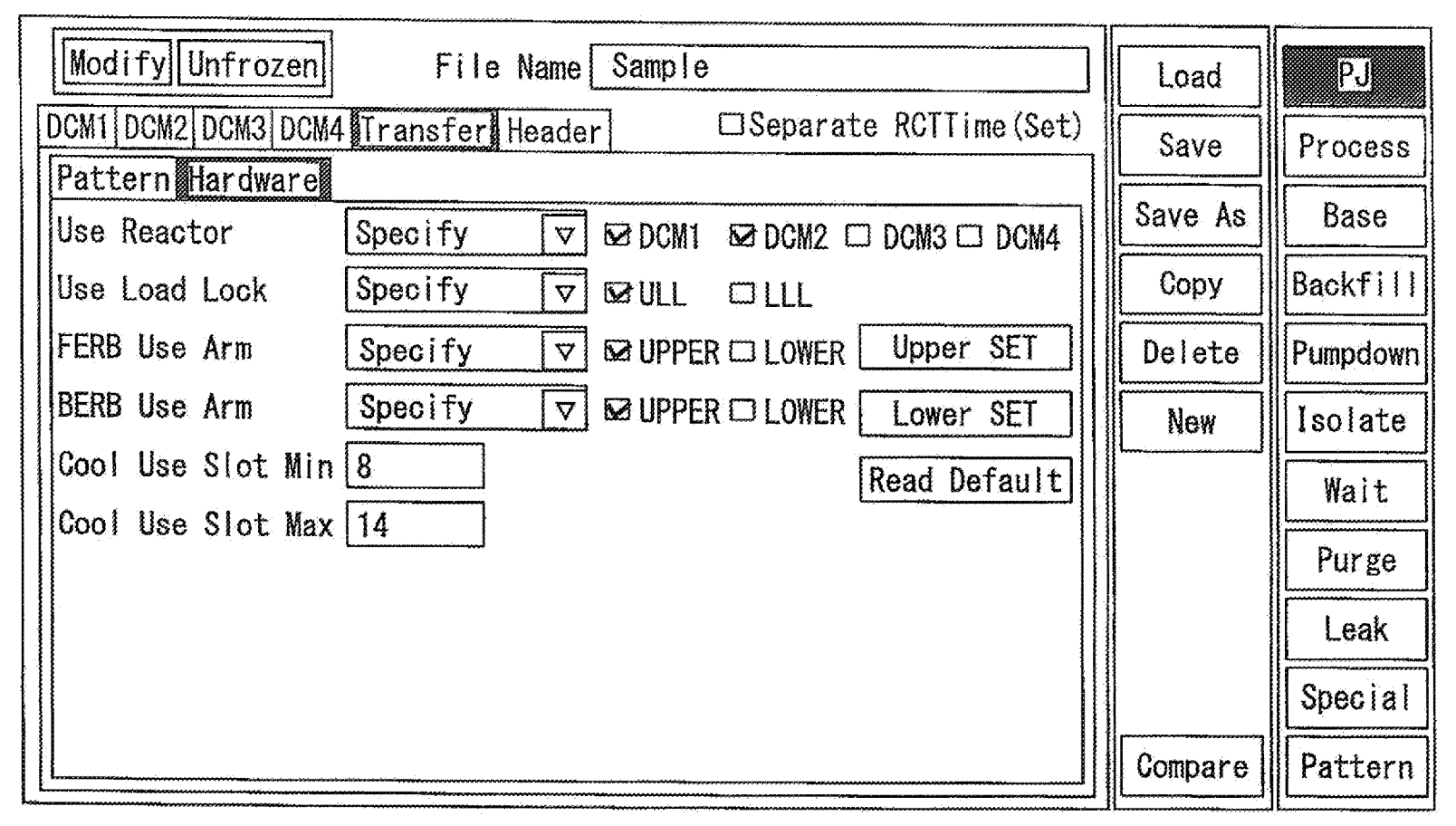

FIG. 5 is a diagram of a screen displaying the content of the metal film forming recipe. As shown, the DCM1 checkbox and the DCM2 checkbox to the right of the Use Reactor dropdown menu have been checked (and the DCM3 checkbox and the DCM4 checkbox have not been checked), indicating that the first processing section 42A and the second processing section 42B have been designated as usable processing sections. Further, as shown, the ULL checkbox to the right of the Use Load Lock dropdown menu has been checked (and the LLL checkbox has not been checked), indicating that the ULLC 36 has been designated as a usable load lock chamber.

In FIG. 5, the term FERB (an acronym for Front End Robot) indicates the first arm 34 and the term BERB (an acronym for Back End Robot) indicates the second arm 40. In FIG. 5, which shows the content of the metal film forming recipe, the UPPER checkboxes to the right of the FERB Use Arm dropdown menu and the BERB Use Arm dropdown menu have been checked (and the LOWER checkboxes have not been checked), indicating that the upper arms 34a and 40a have been designated as usable arms.

Further in FIG. 5, the Cool Use Slot Min box shows a value of 8 and the Cool Use Slot Max box shows a value of 14, indicating that the upper 7 of the cooling stages 52 (i.e., the slots 8 to 14) have been designated as usable cooling stages.

Thus, the metal film forming recipe and the nonmetal film forming recipe designate different arms as usable arms and different processing sections as usable processing sections.

The operation of the substrate processing apparatus of the first embodiment will be described. In the operation of the substrate processing apparatus, the control unit 10 controls the processing unit 30 in a prescribed manner. The load port 32 is where a FOUP containing a plurality of substrates is mounted. Upon a FOUP being mounted on the load port 32, the control unit 10 selects either the metal film forming recipe or the nonmetal film forming recipe and processes the substrates in the FOUP according to the selected recipe. The following describes the operation of the substrate processing apparatus when the substrates in the FOUP must be processed according to the metal film forming recipe.

The control unit 10 of the substrate processing apparatus begins processing of the substrates by reading the metal film forming recipe stored in the recipe storage section 16. According to the read metal film forming recipe, first, a substrate is retrieved from the load port 32 and transferred to the ULLC 36 using the upper arm 34a. (It should be noted that in this case, the ULLC 36 is a usable load lock chamber and the upper arm 34a is a usable arm, as specified by the recipe.) Another substrate is then retrieved from the load port 32 and transferred to the ULLC 36 using the upper arm 34a. Two substrates are then retrieved from the ULLC 36 and transferred to the first processing section 42A (or the second processing section 42B) using the upper arms 40a. (It should be noted that in this case, the first and second processing sections 42A and 42B are usable processing sections and the upper arms 40a are usable arms, as specified by the recipe.) A Ti or W film is then formed on the substrates in the first processing section 42A under the processing conditions specified by the metal film forming recipe.

Next, the substrates are retrieved from the first processing section 42A and then transferred to the ULLC 36 using the upper arms 40a. The substrates are successively retrieved from the ULLC 36 and transferred to one of the cooling stages 52 (specifically, one of the slots 8 to 14) using the upper arm 34a. The substrates are then held on that cooling stage 52 for a predetermined period of time before it is returned to the FOUP on the load port 32 using the upper arm 34a.

Now, the following describes the operation of the substrate processing apparatus when the substrates in the FOUP must be processed according to the nonmetal film forming recipe. The control unit 10 of the substrate processing apparatus reads the nonmetal film forming recipe stored in the recipe storage section 16. According to the read nonmetal film forming recipe, first, a substrate is retrieved from the load port 32 and transferred to the LLLC 38 using the lower arm 34b. (It should be noted that in this case, the LLLC 38 is a usable load lock chamber and the lower arm 34b is a usable arm, as specified by the recipe.) Another substrate is then retrieved from the load port 32 and transferred to the LLLC 38 using the lower arm 34b. Two substrates are then retrieved from the LLLC 38 and transferred to the third processing section 42C (or the fourth processing section 42D) using the lower arms 40b. (It should be noted that in this case, the third and fourth processing sections 42C and 42D are usable processing sections and the lower arms 40b are usable arms, as specified by the recipe.) An oxide or nitride film is then formed on the substrates in the third processing section 42C under the processing conditions specified by the nonmetal film forming recipe.

Next, the substrates are retrieved from the third processing section 42C and transferred to the LLLC 38 using the lower arms 40b. The substrates are successively retrieved from the LLLC 38 and transferred to one of the cooling stages 52 (specifically, one of the slots 1 to 7) using the lower arm 34b. The substrates are then held on that cooling stage 52 for a predetermined period of time before it is returned to the FOUP on the load port 32 using the lower arm 34b.

Thus, the control unit 10 causes the substrate processing apparatus to operate according to a recipe. Specifically, in the substrate processing apparatus, a substrate to be processed is transferred to a usable processing section by the usable arm and processed under processing conditions specified by the recipe, under the control of the control unit 10. Further, the control unit 10 controls a usable arm to transfer a substrate to a usable cooling stage or a usable load lock chamber. It should be noted that the control unit 10 opens or closes one or more of the gate valves 44 as necessary when a substrate is transferred within the substrate processing apparatus.

The arms, the processing sections, the load lock chamber, and the cooling stages which are used in the substrate processing according to the metal film forming recipe are not used in the substrate processing according to the nonmetal film forming recipe. (That is, the upper arms 40a and 34a, the processing sections 42A and 42B, the ULLC 36, and the slots 8 to 14 are not used in the substrate processing according to the nonmetal film forming recipe.) Therefore, metal contamination on these arms, processing sections, load lock chamber, and cooling slots is prevented from adhering to the substrates processed according to the nonmetal film forming recipe. Further, the substrate processing according to the metal film forming recipe and that according to the nonmetal film forming recipe may be performed concurrently, resulting in efficient processing of substrates.

In the first embodiment, the substrate processing apparatus switches from one recipe to the other on a lot basis. However, in other embodiments, the substrate processing apparatus may switch from one recipe to the other on a substrate by substrate basis. This makes it possible to process some substrates in a lot according to the metal film forming recipe and other substrates in the lot according to the nonmetal film forming recipe.

In the processing sections of the substrate processing apparatus of the first embodiment, a film is formed on a substrate, as described above. It should be noted, however, that the present invention may be applied to a wide variety of substrate processing apparatuses having a plurality of processing sections and a plurality of arms and in which a plurality of substrates are processed under different processing conditions. For example, in the processing sections of these substrate processing apparatuses, substrates may be subjected to a process other than a film forming process, such as exposure, development, etching, CMP, cleaning, or drying. In such cases, different processing sections and different arms may be used for different processing conditions (i.e., different types of processes). This prevents contamination resulting from processing of substrates under some processing conditions from adhering to substrates processed under other processing conditions.

The substrate processing apparatus of the first embodiment may have any plurality of processing sections, any plurality of load lock chambers, and any plurality of cooling stages. Further, any number of substrates may be concurrently processed in a processing section.

Further, for example, the cooling stages 52, the ULLC 36, the LLLC 38, and the first arm 34 may be omitted from the substrate processing apparatus of the first embodiment, and a substrate may be directly loaded from the load port 32 using the second arm 40. However, a plurality of processing sections and a plurality of arms are required to implement a substrate processing apparatus incorporating the present invention, whatever processing the substrate processing apparatus may perform. Therefore, even the simplest recipe of the present invention designates usable arms and usable processing sections and specifies processing conditions in the usable processing sections. According to such a recipe, the control unit 10 controls the movement of all arms and the processing in all processing sections of the substrate processing apparatus so that substrates are transferred using the usable arms and processed in the usable processing sections under the specified processing conditions.

Although the recipe storage section 16 has been described as storing a metal film forming recipe and a nonmetal film forming recipe, it is to be understood that the present invention is not limited to these particular recipes. For example, the recipe storage section 16 may store a first recipe for forming a first film and a second recipe for forming a second film different from the first film. In such cases, the first recipe and the second recipe designate different arms as usable arms. Further, the first recipe and the second recipe designate different processing sections as usable processing sections. Such designation of usable arms and usable processing sections by the recipes is desired since forming different types of films results in generation of different types of particles.

These alterations may also be made to the substrate processing apparatus of the subsequently described embodiment. The description of that substrate processing apparatus will be primarily limited to the differences from the substrate processing apparatus of the first embodiment.

Second Embodiment

The substrate processing apparatus in accordance with a second embodiment of the present invention has a control unit that is configured to allow one to designate usable arms, usable processing sections, usable cooling stages, and a usable load lock chamber by use of system parameters. This means that, by setting these system parameters, the user can permit the use of some components of the processing unit 30 while prohibiting the use of other components of the processing unit 30.

Figure 6:
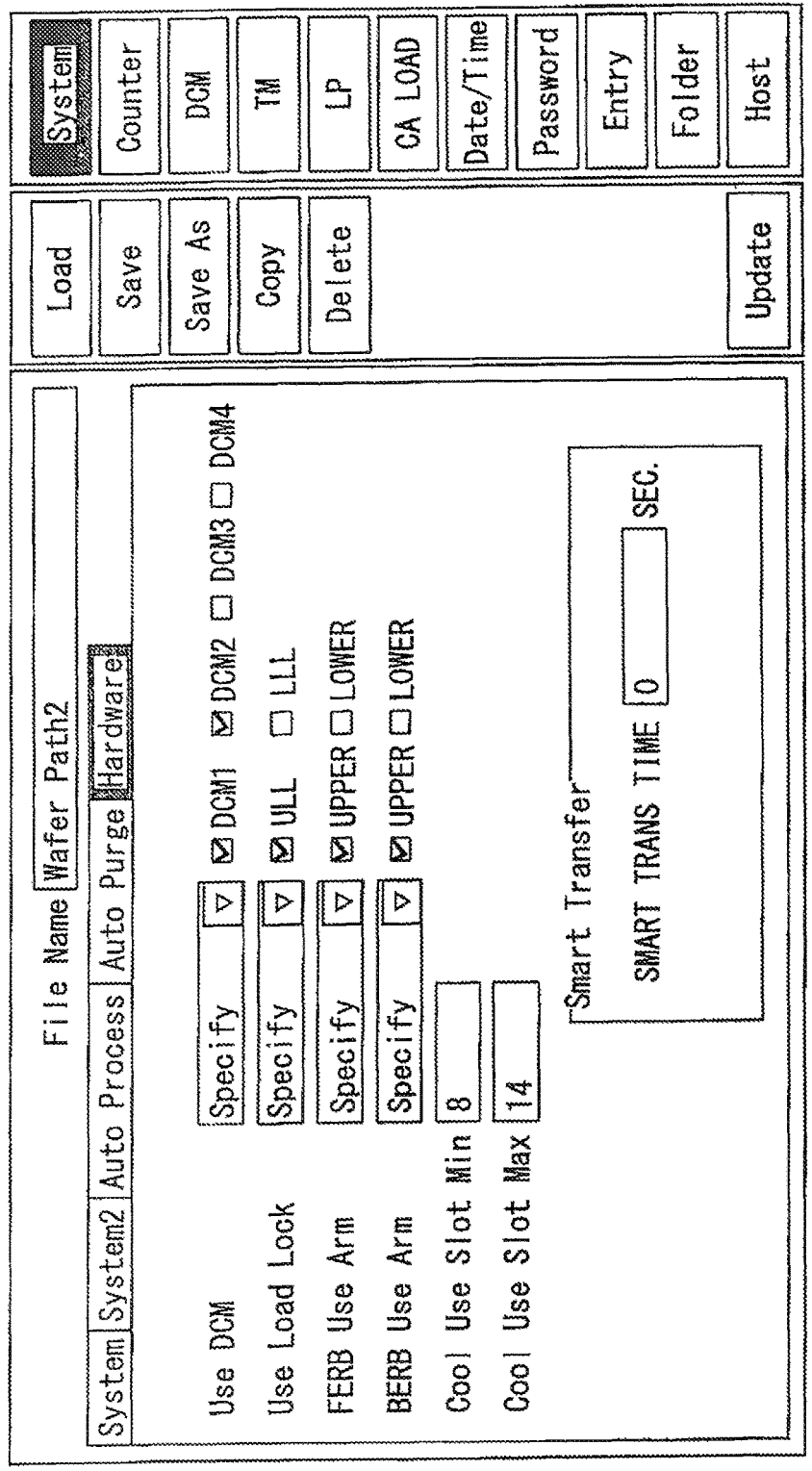
FIG. 6 shows the system parameter setting screen of the substrate processing apparatus of the second embodiment.

FIG. 6 shows the system parameter setting screen of the substrate processing apparatus of the second embodiment after the system parameters have been set for a particular type of film. Specifically, the system parameter setting screen shown in FIG. 6 shows that the first processing section 42A (represented by the DCM1 checkbox in the screen), the second processing section 42B (represented by the DCM2 checkbox), the ULLC 36, the upper arms 34a and 40a, and the upper 7 of the cooling stages 52 (i.e., the slots 8 to 14) can be used. These components of the control unit 30 are herein referred to collectively as the first group of components.

With this system parameter setting, it is prohibited to use the third processing section 42C, the fourth processing section 42D, the LLLC 38, the lower arms 34b and 40b, and the lower 7 of the cooling stages 52 (i.e., the slots 1 to 7). This group of components of the control unit 30 is herein referred to as the second group of components. That is, with this system parameter setting, the second group of components cannot be used, regardless of the content of the recipe used.

For example, when a metal film is formed in the substrate processing apparatus, the system parameters may be set such that the use of the first group of components is permitted and the use of the second group of components is prohibited; and when a nonmetal film is formed in the substrate processing apparatus, the system parameters may be set such that the use of the second group of components is permitted and the use of the first group of components is prohibited. This prevents contamination resulting from formation of metal films from adhering to substrates on which a nonmetal film is formed. It should be noted that, whereas a change in the system configuration requires a system reboot, a change in the system parameters does not, meaning that the substrate processing apparatus of the second embodiment is convenient to use.

Features of the substrate processing apparatuses of the embodiments described above may be combined where appropriate.

Obviously many modifications and variations of the present invention are possible in the light of the above teachings. It is therefore to be understood that within the scope of the appended claims the invention may be practiced otherwise than as specifically described.

What is claimed is:

1. A substrate processing apparatus comprising:
a plurality of arms used for transferring a substrate;
a plurality of processing sections for processing said substrate; and
a processor for controlling movement of said plurality of arms and controlling processing in said plurality of processing sections, wherein
said processor is configured so that, using system parameters, at least one of said plurality of arms can be designated as a usable arm and at least one of said plurality of processing sections can be designated as a usable processing section,
different ones of said plurality of processing sections and different ones of said plurality of arms are used for different processing conditions,
and ones of said plurality of arms other than said usable arm and ones of said plurality of processing sections other than said usable processing section cannot be used regardless of content of a recipe.

2. The substrate processing apparatus according to claim 1, further comprising:
a plurality of cooling stages for cooling a substrate, and
a plurality of load lock chambers, wherein
said processor is configured so that, using system parameters, at least one of said plurality of cooling stages can be designated as a usable cooling stage and at least one of said plurality of load lock chambers can be designated as a usable load lock chamber.

3. The substrate processing apparatus according to claim 1, wherein each of the plurality of arms can transfer the substrate from a common start point to a common end point.

4. The substrate processing apparatus according to claim 1, wherein the plurality of processing sections are position circumferentially around the plurality of arms, and the plurality of arms are located in a vacuum chamber.

5. The substrate processing apparatus according to claim 1, wherein the plurality of arms includes an upper arm and lower arm transferring substrates separately.

* * * * *